(12) United States Patent
Inagaki et al.

(10) Patent No.: US 8,704,439 B2
(45) Date of Patent: Apr. 22, 2014

(54) BLUE-LIGHT-EMITTING PHOSPHOR AND LIGHT-EMITTING DEVICE EQUIPPED WITH THE BLUE-LIGHT-EMITTING PHOSPHOR

(75) Inventors: Toru Inagaki, Ube (JP); Masato Yamauchi, Ube (JP); Seiji Noguchi, Ube (JP); Kouichi Fukuda, Ube (JP); Akira Ueki, Ube (JP)

(73) Assignee: Ube Material Industries, Ltd., Ube-shi, Yamaguchi (JP)

( * ) Notice: Subject to any disclaimer, the term of this patent is extended or adjusted under 35 U.S.C. 154(b) by 0 days.

(21) Appl. No.: 13/821,349

(22) PCT Filed: Sep. 7, 2011

(86) PCT No.: PCT/JP2011/070354
§ 371 (c)(1),
(2), (4) Date: Apr. 8, 2013

(87) PCT Pub. No.: WO2012/033122
PCT Pub. Date: Mar. 15, 2012

(65) Prior Publication Data
US 2013/0200777 A1    Aug. 8, 2013

(30) Foreign Application Priority Data
Sep. 7, 2010    (JP) ................. 2010-199702

(51) Int. Cl.
*H05B 33/14*    (2006.01)
*C09K 11/77*    (2006.01)

(52) U.S. Cl.
USPC ...... 313/502; 313/504; 313/512; 252/301.4 F

(58) Field of Classification Search
USPC .............................. 313/500–512; 252/301 R
See application file for complete search history.

(56) References Cited

U.S. PATENT DOCUMENTS

| | | | |
|---|---|---|---|
| 2007/0029565 A1* | 2/2007 | Masuda et al. | 257/98 |
| 2009/0002603 A1* | 1/2009 | Otsuka et al. | 349/69 |
| 2013/0244033 A1* | 9/2013 | Inagaki et al. | 428/402 |

* cited by examiner

*Primary Examiner* — Tracie Y Green
(74) *Attorney, Agent, or Firm* — Nixon Peabody LLP; Jeffrey L. Costellia

(57) ABSTRACT

A blue light-emitting phosphor having an elemental formula of $Sr_{3-x}MgSi_2O_8:Eu_x$ (wherein x represents a value in the range of 0.008 to 0.110), a merwinite crystal structure and a crystal lattice strain of 0.080% or less as determined from an X-ray diffraction pattern at diffraction angle $2\theta$ of 20-130° by the Le Bail method, wherein the X-ray diffraction pattern is determined using a $CuK\alpha$ ray having an incident angle of $\theta$, is used advantageously as a blue light-emitting material for a light-emitting device which comprises a semiconductor light-emitting element capable of emitting a light having a wavelength of 350-430 nm upon application of an electrical current, such as a white light-emitting LED lamp, and a blue light-emitting material capable of emitting a blue light upon excitation with a light emitted by the semiconductor light-emitting element.

6 Claims, 1 Drawing Sheet

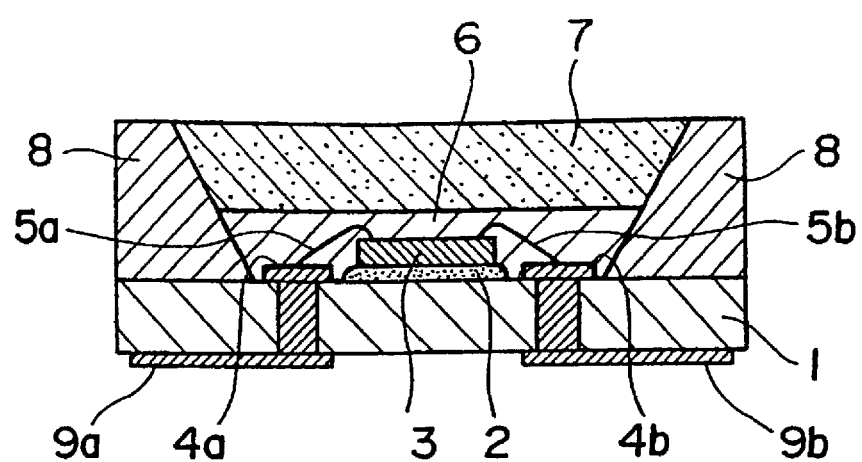

BLUE-LIGHT-EMITTING PHOSPHOR AND LIGHT-EMITTING DEVICE EQUIPPED WITH THE BLUE-LIGHT-EMITTING PHOSPHOR

FIELD OF THE INVENTION

The present invention relates to a blue light-emitting silicate phosphor favorably employable as a blue light-emitting phosphor for a white light-emitting LED. The invention particularly relates a blue light-emitting phosphor having an elemental formula of $Sr_3MgSi_2O_8$:Eu and a merwinite crystal structure.

BACKGROUND OF THE INVENTION

White light-emitting LED lamps have been practically employed as a back-light of a liquid crystal display panel or a lighting. The conventionally employed light-emitting LEDs are of a double color admixture type of which white light is produced by mixing a blue light released from a semiconductor light-emitting element by application with electric energy and a yellow light emitted by a yellow light-emitting phosphor when excited with the blue light from the semiconductor light-emitting element. However, there is a problem in the white light emitted by the white light-emitting LED lamp of the double color admixture type, in that the white light is not sufficiently pure. Therefore, there have been studied white light-emitting LED lamps of a triple color admixture type which give a white light by mixing a blue light, a green light and a red light. The blue light, green light and red light are all released respectively from a blue light-emitting phosphor, a green light-emitting phosphor and a red light-emitting phosphor by excitation with a light in the wavelength region of 350 to 430 nm which is released from a semiconductor light-emitting element by applying thereto electric energy.

The white light-emitting LED lamp generally comprises a light-emitting semiconductor element and a phosphor layer placed around the light-emitting semiconductor element. The phosphor layer comprises a transparent material and a phosphor dispersed therein. The transparent material generally is a thermoplastic resin such as a silicone resin. The phosphor layer is generally produced by heating a mixture of a phosphor and a transparent material until the mixture is softened, and then cooling the softened mixture until it is cured.

As a blue light-emitting phosphor, there is known a blue light-emitting silicate phosphor having an elemental formula of $Sr_3MgSi_2O_8$ activated with a divalent Eu and a merwinite crystal structure, that is, a crystal structure equivalent to the merwinite ($Ca_3MgSi_2O_8$). This blue light-emitting silicate phosphor is hereinafter referred to as SMS blue light-emitting phosphor. The SMS blue light-emitting phosphor has been studied for the use as a blue light-emitting material to be placed in a plasma display as well as in a white light-emitting LED of the three color mixture type, as is disclosed in JP 2009-280793A.

In more detail, JP 2009-280793 A describes the use of a blue light-emitting phosphor comprising a main (primary) crystal phase of $M^1_3MgSi_2O_8$ ($M^1$ is Sr and Ba) crystal comprising Eu and a secondary crystal phase of $M^1_2MgSi_2O_7$.

SUMMARY OF THE INVENTION

A phosphor to be placed in a white light-emitting LED lamp which comprises a semiconductor element emitting a light in the wavelength region of 350 to 430 nm by application with electric energy and a phosphor emitting a visible light when excited with the light emitted by the light-emitting semiconductor element is required to emit a light of high intensity when it is excited with the light in the wavelength region of 350 to 430 nm. In addition, the phosphor is required to show high stability even after the phosphor is heated in the step of producing the phosphor layer.

Accordingly, it is the object of the present invention to provide a blue light-emitting phosphor giving a light of high intensity when excited with a light of a wavelength region in the range of 350 to 430 nm and further showing high resistance to heat treating.

The inventors of the invention have found that a blue light-emitting phosphor having an elemental formula of $Sr_{3-x}MgSi_2O_8$:$Eu_x$ in which x is a value in the range of 0.008 to 0.110, a merwinite crystal structure, and a crystal lattice strain of 0.080% or less, the crystal lattice strain being determined from an X-ray diffraction pattern in the region of 20 to 130° in terms of a diffraction angle 2θ by the Le Bail method, the X-ray diffraction pattern being obtained using CuKα ray having an incident angle of θ gives a blue light emission having a peak wavelength in the wavelength region of 435 to 480 nm when excited with a light in the wavelength region of 350 to 430 nm, and further that the above-mentioned blue light-emitting phosphor shows high resistance to heat treatment. The present invention has been made based on this finding.

Accordingly, the present invention resides in a blue light-emitting phosphor for the use as a blue light-emitting material to be placed in a light-emitting device which comprises a semiconductor element emitting a light in the wavelength region of 350 to 430 nm by applying electric energy and a blue light-emitting material emitting a blue light when excited with the light emitted by the semiconductor element, which has an elemental formula of $Sr_{3-x}MgSi_2O_8$:$Eu_x$ in which x is a value in the range of 0.008 to 0.110, a merwinite crystal structure, and a crystal lattice strain of 0.080% or less, the crystal lattice strain being determined from an X-ray diffraction pattern in the region of 20 to 130° in terms of a diffraction angle 2θ by the Le Bail method, the X-ray diffraction pattern being obtained using CuKα ray having an incident angle of θ. The crystal lattice strain preferably is in the range of 0.025 to 0.080%.

The invention further resides in a light-emitting device comprising a semiconductor element emitting a light in the wavelength region of 350 to 430 nm by applying electric energy and a blue light-emitting material emitting a blue light when excited with the light emitted by the semiconductor element, in which the blue light-emitting material is a blue light-emitting phosphor having an elemental formula of $Sr_{3-x}MgSi_2O_8$:$Eu_x$ in which x is a value in the range of 0.008 to 0.110, a merwinite crystal structure, and a crystal lattice strain of 0.080% or less, the crystal lattice strain being determined from an X-ray diffraction pattern in the region of 20 to 130° in terms of a diffraction angle 2θ by the Le Bail method, the X-ray diffraction pattern being obtained using CuKα ray having an incident angle of θ.

Preferred embodiments of the above-mentioned light-emitting device are described below.

(1) The crystal lattice strain of the blue light-emitting phosphor is in the range of 0.025 to 0.080%.

(2) The blue light-emitting phosphor is dispersed in a transparent material and placed around the semiconductor element.

(3) In the transparent material, a green light-emitting phosphor emitting a green light when excited with the light emitted by the semiconductor element and a red light-emitting phosphor emitting a red light when excited with the light emitted by the semiconductor element are dispersed.

The blue light-emitting phosphor of the invention emits a blue light of high emission intensity when excited with a light in the wavelength region of 350 to 430 nm and is highly resistant to heat treatment. Therefore, the blue light-emitting phosphor of the invention is favorably employable as a blue light-emitting material to be placed in a light-emitting device (such as a white light-emitting LED lamp) comprising a semiconductor element emitting a light in the wavelength region of 350 to 430 nm when received electric energy and a blue light-emitting material emitting a blue light upon receiving the light emitted by the semiconductor element.

BRIEF DESCRIPTION OF DRAWINGS

FIG. 1 shows a section of a white light-emitting LED according to the invention.

DETAILED DESCRIPTION OF THE INVENTION

The blue light-emitting phosphor of the invention has an elemental formula of $Sr_{3-x}MgSi_2O_8:Eu_x$ (x is a value in the range of 0.008 to 0.110) and a merwinite crystal structure, namely, a crystal structure equivalent to that of merwinite. In the elemental formula, x preferably is a value in the range of 0.008 to 0.095, more preferably is a value in the range of 0.008 to 0.070.

Further, the blue light-emitting phosphor of the invention has a crystal lattice strain of 0.080% or less (preferably in the range of 0.025 to 0.080%, more preferably in the range of 0.40 to 0.070%), in which the crystal lattice strain is determined from an X-ray diffraction pattern in the region of 20 to 130° (in terms of a diffraction angle 2θ) by the Le Bail method, in which the X-ray diffraction pattern is obtained using CuKα ray having an incident angle of θ.

In other words, the crystal lattice strain described herein is a value obtained from a diffraction peak assigned to a blue light-emitting phosphor having a merwinite crystal structure in which the diffraction peak is observed in an X-ray diffraction pattern within 20 to 130° (in terms of 2θ), which is obtained using CuKα ray. The crystal lattice strain referred to herein means a deviation from the spacing of net plane of the ideal blue light-emitting phosphor crystal.

The crystal lattice strain is determined by the Le Bail method. La Bail method referred to in the specification is a method of calculating a crystal lattice strain (%) by first obtaining the parameters U, V and W of the Cagliotti formula from θ and strength of the diffraction peak in the X-ray diffraction pattern and a half-width (FWHM) by Le Bail fitting method and then subjecting the obtained parameters of U and W to calculation according to Pseudo-Voigt function.

In the process for obtaining the crystal lattice strain of a blue light-emitting phosphor, the diffusion of half-width derived from the X-ray diffraction apparatus is corrected using a standard sample for the X-ray diffraction measurement which has no lattice strain. In more detail, the crystal lattice strain of a blue light-emitting phosphor can be obtained by the below-mentioned procedures.

In the first step, an X-ray diffraction pattern in the region of 20 to 130° (in terms of 2θ) is obtained for each of the blue light-emitting phosphor and a standard sample for the X-ray diffraction measurement using CuKα ray. The X-ray diffraction pattern is obtained by the powder X-ray diffraction method.

In the second step, the parameters U, V and W of the below-mentioned Cagliotti formula (I) from the θ, strength and half-width (FWHM) of the diffraction peak observed in the X-ray diffraction pattern for each of the blue light-emitting phosphor and the standard sample for the X-ray diffraction measurement using the Le Bail fitting procedure:

$$FWHM = (U \tan^2 \theta + V \tan \theta + W)^{1/2} \quad (I)$$

in which FWHM means a half-width of the diffraction peak, θ means a Bragg angle of the diffraction peak, U is a parameter concerning the crystal lattice strain, and V and W both are parameters concerning the crystallite.

Then, the crystal lattice strain (%) is obtained from the parameters U and W for each of the blue light-emitting phosphor and standard sample for the X-ray diffraction measurement using the below-mentioned Pseudo-Voigt function (II):

$$\text{Crystal lattice strain (\%)} = \{[(U_i - U_{std}) - (W_i - W_{std})]^{1/2}\} / \{1/100 \times (180/\pi) \times 4 \times (2\text{Ln}2)^{1/2}\} \quad (II)$$

in which $U_i$ and $W_i$ are parameters U and W, respectively, of the blue light-emitting phosphor and $U_{std}$ and $W_{std}$ are parameters U and W, respectively, of the standard sample for the X-ray diffraction measurement.

In the elemental formula of the SMS blue light-emitting phosphor of the invention, the molar ratio among the metal elements may deviate from the formula, provided that the SMS blue light-emitting phosphor has the merwinite crystal structure. However, it is preferred that the total molar amount of Sr and Eu is in the range of 2.9 to 3.1 mols and Si is in the range of 1.9 to 2.1 mols, per one mol of Mg.

The SMS blue light-emitting phosphor may contain Ba and Ca. However, Ba is generally not more than 0.4 mol, preferably not more than 0.2 mol, more preferably not more than 0.08 mol, and most preferably not more than 0.01 mol, per one mol of Mg, and Ca is generally not more than 0.08 mol, preferably not more than 0.01 mol, per one mol of Mg.

The blue light-emitting phosphor of the invention can be produced by calcining a mixture of a powdery strontium source, a powdery magnesium source, a powdery silicon source and a powdery europium source in the presence of a fluorine-containing compound or a chlorine-containing compound.

Each of the powdery sources, namely, a powdery strontium source, a powdery magnesium source, a powdery silicon source and a powdery europium source can be a powder of an oxide or a compound which is converted into an oxide by calcination, such as, a hydroxide, a halide, a carbonate (except a basic carbonate), a nitrate, or an oxalate. One or more powdery sources can be employed for each powdery source.

The powdery sources preferably has a purity of not less than 99 wt. %. Particularly, the powdery magnesium source preferably has a purity of not less than 99.95 wt. %.

The powdery strontium source, powdery magnesium source, powdery silicon source and powder europium source are mixed generally under conditions that the magnesium and silicon are contained in the powdery mixture in amounts of 0.9 to 1.1 mols and 1.9 to 2.1 mols, respectively, per 3 mols of the total amount of strontium and europium contained in the powdery mixture.

Each of the fluorine-containing compound and chlorine-containing compound is preferably added to the powdery mixture in the form of a powder. It is preferred that the powdery fluorine-containing compound and powdery chlorine-containing compound are a powdery fluoride and a powdery chloride, respectively, of strontium magnesium silicon and/or europium. More preferably, powdery strontium fluoride or powdery strontium chloride is employed. Each of the powdery fluorine-containing compound and powder chlorine-containing compound is preferably employed in an amount of 0.02 to 0.5 mol in terms of a molar amount of fluorine or chlorine, per 3 mols of the total amount of strontium and europium in the powdery mixture.

The powder mixture can be produced by any one of the known dry mixing process and wet mixing process. For example, the wet mixing process can be carried out by means of a rotating ball mill, a vibrating ball mill, a planetary mill, a paint shaker, a locking mill, a locking mixer, a bead mill, or a stirrer. In the wet mixing process, a solvent such as water or a lower alcohol (e.g., ethanol or isopropanol) can be employed.

The calcination of the powdery mixture can be performed in a reducing gas atmosphere. The reducing gas can be a mixture of 0.5 to 5.0 vol. % of hydrogen and 99.5 to 95.0 vol. % of an inert gas such as argon or nitrogen. The calcination can be carried out generally at 900 to 1,300° C., preferably at 1,100 to 1,200° C., for a period of time in the range of 0.5 to 100 hours.

If the powdery compound is a powder of a compound convertible to an oxide by calcination, the powdery compound is preferably pre-calcined at 600 to 850° C. for 0.5 to 100 hours, in atmospheric conditions. The calcined mixture can be post-treated by such procedures as classification, acid treatment using a mineral acid such as hydrochloric acid or nitric acid, or baking.

The light-emitting device employing the blue light-emitting SMS phosphor of the invention is described below, referring to the attached FIG. 1 in which a white light-emitting LED is illustrated.

FIG. 1 is a section of one embodiment of the white light-emitting LED employing the blue light-emitting SMS phosphor of the invention.

In FIG. 1, the white light-emitting LED comprises a base 1, a semiconductor light-emitting element 3 fixed onto the base 1 via an adhesive 2, a pair of electrodes 4a,4b formed on the base 1, electric leads 5a,5b electrically connecting the semiconductor light-emitting element 3 with the electrodes 4a,4b, a resin layer 6 covering the semiconductor light-emitting element 3, a phosphor-containing resin composition layer 7 formed on the resin layer 6, a light-reflecting material 8 covering the resin layer 6 and phosphor layer 7, and electric wires 9a, 9b connecting the electrodes 4a, 4b with an outside electric source (not shown).

The phosphor layer 7 is formed of a transparent material in which the blue light-emitting SMS phosphor, as well as a green light-emitting phosphor and a red light-emitting phosphor are dispersed. The transparent material can be glass or silicone resin.

When electric energy is applied to the electrodes 4a, 4b via the electric wires 9a, 9b, the semiconductor element 3 emits a light having a peak in the wavelength region of 350 to 430 nm. This light excites each phosphors contained in the phosphor layer 7 to release visible lights such as a blue light, a green light and a red light. The blue light, green light and red light are mixed to give the white light.

The semiconductor light-emitting element 3 can be an AlGaN type light-emitting semiconductor element.

The resin layer 6 can be made of silicone resin. The phosphor layer 7 may contain a green light-emitting phosphor and a red light-emitting phosphor. The green light-emitting phosphor can be $(Ca,Sr,Ba)_2SiO_4:Eu^{2+}$, $BaMgAl_{10}O_{17}:Eu^{2+}$, $Mn^{2+}$, $\alpha$-SiAlON:$Eu^{2+}$, $\beta$-SiAlON:$Eu^{2+}$, ZnS:Cu, Al. The red light-emitting phosphor can be $Y_2O_2S:Eu^{2+}$, $La_2O_3S:Eu^{2+}$, $(Ca, Sr, Ba)_2Si_5N_8: Eu^{2+}$, $CaAlSiN_3: Eu^{2+}$, $Eu_2W_2O_9$, $(Ca, Sr, Ba)_2Si_5N_8: Eu^{2+}$, $Mn^{2+}$, $CaTiO_3:Pr^{3+}$, $Bi^{3+}$, or $(La, Eu)_2W_3O_{12}$.

[Examples 1-6 and Comparison Example 1]

A powdery $SrCO_3$ (purity: 99.99 wt. %, mean particle size: 2.73 μm), a powdery $SrCl_2$ (purity: 99.99 wt. %), a powdery $SrF_2$ (purity: 99.5 wt. %), a powdery basic $MgCO_3$ ($4MgCO_3.Mg(OH)_2.4H_2O$) powder (purity: 99.99 wt. %, mean particle size: 11.08 μm), a powdery $SiO_2$ (purity: 99.9 wt. %, mean particle size: 3.87 μm), and a powdery $Eu_2O_3$ (purity: 99.9 wt. %, mean particle diameter: 2.71 μm) were weighed in the molar amounts set forth in Table 1. The mean particle diameters of the powdery materials were determined by the laser diffraction-scattering spectroscopy.

TABLE 1

| | Molar amount | | | | | |
|---|---|---|---|---|---|---|
| | $SrCO_3$ | $SrCl_2$ | $SrF_2$ | $MgCO_3$* | $SiO_2$ | $Eu_2O_3$ |
| Ex. 1 | 2.9150 | 0.0750 | 0 | 0.2000 | 2.000 | 0.0050 |
| Ex. 2 | 2.9000 | " | " | " | " | 0.0125 |
| Ex. 3 | 2.8950 | " | " | " | " | 0.0150 |
| Ex. 4 | 2.8650 | " | " | " | " | 0.0300 |
| Ex. 5 | 2.8350 | " | " | " | " | 0.0450 |
| Ex. 6 | 2.9250 | 0 | 0.0150 | " | " | 0.0300 |
| Com. 1 | 2.9400 | 0 | 0 | " | " | 0.0300 |

Remarks: $MgCO_3$* is a basic $MgCO_3$.

The powdery materials and pure water (750 mL) were placed in a ball mill, and mixed for 24 hours, and heated to distill water off, to give a powdery mixture. The powdery mixture was placed in an alumina crucible and calcined at 800° C. for 3 hours in atmospheric conditions. The calcined powdery mixture was allowed to stand to room temperature, and subsequently calcined at 1,200° C. for 3 hours in the gaseous atmosphere comprising 2 vol. % of hydrogen and 98 vol. % of argon, to give a powdery calcined product. The powdery calcined product was sieved on a polyamide sieve having a pore size of 20 μm to remove large particles and then dried.

The powdery calcined products produced in Examples 1-6 and Comparison Example 1 were subjected to procedures for obtaining an X-ray diffraction pattern and an emission spectrum observed when the product is excited with a ultra-violet rays having a wavelength of 395 nm.

The results indicate that all of the powdery calcined products of Examples 1-6 and Comparison Example 1 have the merwinite crystal structure and emit a blue light under excitation with the ultra-violet rays.

The blue light-emitting phosphors produced in Examples 1-6 and Comparison Example 1 were subjected to the measurements of crystal lattice strain, initial emission strength and retention of emission strength after heat treatment. The results together with the compositions of the blue light-emitting phosphors are set forth in Table 2.

[Measurement of Crystal Lattice Structure]

An X-ray diffraction pattern was obtained for each of the blue light-emitting phosphor and standard sample for X-ray diffraction measurement [$LaB_6$ powder available from NIST (National Institute of Standards and Technology)]. The measurement conditions are as follows:

X-ray diffraction apparatus: X' PertProMPD (available from Spectris Co., Ltd.)

X ray: CuKα

Detector: X' Clelerator equipped with monocrometer

Tube voltage: 45 kV

Tube current: 40 mA

Measurement range: 2θ=20 to 130°

Step size: 0.0167°

Divergent slit: ½°, fixed slit

Scan rate: 25.06°/min.

The calculation of the crystal lattice strain was calculated from the X-ray diffraction pattern of each of the blue light-emitting phosphor and standard sample for X-ray diffraction measurement according to the Le Bail method by means of the software (X' Pert Highscore Plus (Ver. 2.2)) installed in the X-ray diffraction apparatus.

[Measurement of Initial Emission Strength]

The blue light-emitting phosphor was exposed to ultra-violet rays having a wavelength of 395 nm and the emission spectrum of the released emission was obtained. The value of the maximum peak in the emission spectrum was detected to give the initial emission strength. In Table 2, the initial emission strength is given in terms of a value relative to the emission strength (assigned to 100) of the blue light-emitting phosphor obtained in Comparison Example 1.

[Measurement of Emission Strength Retention after Heat Treatment]

The blue light-emitting phosphor was heated at 500° C. for one hour and subsequently cooled to room temperature. The cooled phosphor was exposed to the ultra-violet rays having a wavelength of 395 nm and the emission spectrum was obtained. The value of the maximum peak in the emission spectrum was detected and converted into a value (%) relative to the initial emission strength. The converted value (%) was the emission strength retention ratio.

[Comparison Example 2]

According to the procedures described in Example 1 of JP 2009-280793 A, a powdery barium carbonate, a powder strontium carbonate, a powder magnesium oxide, a powdery silicon dioxide and europium oxide were mixed to give an elemental formula of $M_{3-a}Eu_aMgSi_bO_8$ in which M was $Ba_{0.26}Sr_{0.74}$, a was 0.20, and b was 1.95. In addition, ammonium chloride was added in an amount of 0.15 mol, per one mol of Mg. These powdery materials were mixed, calcined at 1,050° C. for 3 hours in the atmospheric conditions, and cooled. The cooled product was again calcined at 1,250° C. for 9 hours in the mixed gas atmosphere comprising 2 vol. % hydrogen and 98 vol. % argon, to produce a blue light-emitting phosphor having a composition formula of $M_{2.8}MgSi_{1.95}O_8:Eu_{0.20}$ ($M=Ba_{0.26}Sr_{0.74}$). The produced blue light-emitting phosphor was subjected to the measurements of crystal lattice strain and initial emission strength.

TABLE 2

| | Composition | Strain (%) | Initial | Retention (%) |
|---|---|---|---|---|
| Ex. 1 | $Sr_{2.990}MgSi_2O_8:Eu_{0.010}$ | 0.052 | 288 | 93.5 |
| Ex. 2 | $Sr_{2.975}MgSi_2O_8:Eu_{0.025}$ | 0.052 | 288 | 93.9 |
| Ex. 3 | $Sr_{2.970}MgSi_2O_8:Eu_{0.030}$ | 0.045 | 268 | 89.2 |
| Ex. 4 | $Sr_{2.940}MgSi_2O_8:Eu_{0.060}$ | 0.036 | 248 | 88.0 |
| Ex. 5 | $Sr_{2.910}MgSi_2O_8:Eu_{0.090}$ | 0.044 | 270 | 89.0 |
| Ex. 6 | $Sr_{2.940}MgSi_2O_8:Eu_{0.060}$ | 0.066 | 289 | 94.0 |
| Com. 1 | $Sr_{2.940}MgSi_2O_8:Eu_{0.060}$ | 0.12 | 100 | 59.5 |
| Com. 2 | $M_{2.80}MgSi_{1.95}O_8:Eu_{0.20}$ ($M=Ba_{0.26}Sr_{0.74}$) | 0.086 | 155 | — |

Remarks: "Strain" means crystal lattice strain.
"Initial" means initial emission strength.
"Retention" means an emission strength retention after heat treatment.
"—" means "not determined".

The composition was described according to the amounts of the mixed powder sources.

As is clear from the results set forth in Table 2, the blue light-emitting phosphor of the invention (Examples 1-6) having a crystal lattice strain of 0.080% or less gives a high initial emission strength, a high emission strength retention after treatment, and an excellent heat stability, as compared with the blue light-emitting phosphor (Comparison Example 1) having a crystal lattice strain of 0.12%.

[Explanation of Symbols]

1: base, 2: adhesive, 3: semiconductor light-emitting element, 4a,4b: electrode, 5a,5b: lead wire, 6: resin layer, 7: phosphor layer, 8: light-reflecting material, 9a, 9b: electro-conductive wire

What is claimed is:

1. A blue light-emitting phosphor for the use as a blue light-emitting material to be placed in a light-emitting device which comprises a semiconductor element emitting a light in the wavelength region of 350 to 430 nm by applying electric energy and a blue light-emitting material emitting a blue light when excited with the light emitted by the semiconductor element, which has an elemental formula of $Sr_{3-x}MgSi_2O_8:Eu_x$ in which x is a value in the range of 0.008 to 0.110, a merwinite crystal structure, and a crystal lattice strain of 0.080% or less, the crystal lattice strain being determined from an X-ray diffraction pattern in the region of 20 to 130° in terms of a diffraction angle 2θ by the Le Bail method, the X-ray diffraction pattern being obtained using CuKα ray having an incident angle of θ.

2. The blue light-emitting phosphor of claim 1, in which the crystal lattice strain is in the range of 0.025 to 0.080%.

3. A light-emitting device comprising a semiconductor element emitting a light in the wavelength region of 350 to 430 nm by applying electric energy and a blue light-emitting material emitting a blue light when excited with the light emitted by the semiconductor element, in which the blue light-emitting material is a blue light-emitting phosphor having an elemental formula of $Sr_{3-x}MgSi_2O_8:Eu_x$ in which x is a value in the range of 0.008 to 0.110, a merwinite crystal structure, and a crystal lattice strain of 0.080% or less, the crystal lattice strain being determined from an X-ray diffraction pattern in the region of 20 to 130° in terms of a diffraction angle 2θ by the Le Bail method, the X-ray diffraction pattern being obtained using CuKα ray having an incident angle of θ.

4. The light-emitting device of claim 3, in which the crystal lattice strain of the blue light-emitting phosphor is in the range of 0.025 to 0.080%.

5. The light-emitting device of claim 3, in which the blue light-emitting phosphor is dispersed in a transparent material and placed around the semiconductor element.

6. The light-emitting device of claim 5, in which a green light-emitting phosphor emitting a green light when excited with the light emitted by the semiconductor element and a red light-emitting phosphor emitting a red light when excited with the light emitted by the semiconductor element are dispersed in the transparent material.

* * * * *